US011161959B2

(12) United States Patent
Shishkin et al.

(10) Patent No.: US 11,161,959 B2
(45) Date of Patent: Nov. 2, 2021

(54) COMPOSITE SHIELDING MATERIAL AND A PROCESS OF MAKING THE SAME

(71) Applicant: Tallinn University of Technology, Tallinn (EE)

(72) Inventors: Andrei Shishkin, Jurmala (LV); Tarmo Koppel, Tallinn (EE); Irina Hussainova, Saue (EE)

(73) Assignee: Tallinn University of Technology, Tallinn (EE)

( * ) Notice: Subject to any disclaimer, the term of this patent is extended or adjusted under 35 U.S.C. 154(b) by 453 days.

(21) Appl. No.: 15/780,902

(22) PCT Filed: Dec. 1, 2016

(86) PCT No.: PCT/IB2016/057281
§ 371 (c)(1),
(2) Date: Jun. 1, 2018

(87) PCT Pub. No.: WO2017/093945
PCT Pub. Date: Jun. 8, 2017

(65) Prior Publication Data
US 2018/0346679 A1 Dec. 6, 2018

(30) Foreign Application Priority Data
Dec. 1, 2015 (GB) ..................................... 1521183

(51) Int. Cl.
| C08J 9/32 | (2006.01) |
| H01B 1/24 | (2006.01) |
| H05K 9/00 | (2006.01) |
| C08K 3/04 | (2006.01) |
| C08K 7/26 | (2006.01) |
| B82Y 30/00 | (2011.01) |

(52) U.S. Cl.
CPC ................. *C08J 9/32* (2013.01); *C08K 3/041* (2017.05); *C08K 3/042* (2017.05); *C08K 7/26* (2013.01);
(Continued)

(58) Field of Classification Search
CPC .. C08J 9/32; C08J 9/0071; H01B 1/24; C08K 3/041; C08K 3/042; C08K 7/26;
(Continued)

(56) References Cited

U.S. PATENT DOCUMENTS 7,282,260 B2 * 10/2007 LeGrande ................ C09D 5/24
428/323
2008/0295955 A1 * 12/2008 Cawse ..................... C08J 5/042
156/276

(Continued)

FOREIGN PATENT DOCUMENTS

CN 103554702 A 2/2014
DE 102013007999 A1 * 11/2013 ............... C08J 9/32
(Continued)

OTHER PUBLICATIONS

International Search Report of International Application No. PCT/IB2016/057281, dated Feb. 28, 2017, 4 pages.
(Continued)

*Primary Examiner* — Kara B Boyle
(74) *Attorney, Agent, or Firm* — Maine Cernota & Rardin (57) ABSTRACT

A composite shielding material in the form of syntactic foam where the spherical or spherical-like articles are encompassed by an organic or inorganic matrix material, and coated with a layer of nanostructures such as carbon nanotubes, graphene, graphene flakes. Such articles may be alternatively or additionally be covered with nano-sized metal particles and the mould is filled with organic or inorganic matrix, and micro and/or nano-sized reinforcement elements. Such material possesses both reflective and absorptive properties to improve shielding effectiveness. Also process for making the same is disclosed. The composite material can be used as an electromagnetic, thermal or acoustic shield.

17 Claims, 4 Drawing Sheets

(52) U.S. Cl.
CPC .............. *H01B 1/24* (2013.01); *H05K 9/0083* (2013.01); *B82Y 30/00* (2013.01)

(58) Field of Classification Search
CPC .... H05K 9/0083; H05K 9/0081; B82Y 30/00; C04B 38/08
See application file for complete search history.

(56) References Cited

U.S. PATENT DOCUMENTS

2013/0177740 A1 7/2013 Merrill et al.
2013/0221285 A1 8/2013 Song et al.

FOREIGN PATENT DOCUMENTS

| | | |
|---|---|---|
| DE | 102013007999 A1 | 11/2013 |
| GB | 1457160 A | 12/1976 |
| WO | 2009101498 A2 | 8/2009 |
| WO | 2013123584 A1 | 8/2013 |

OTHER PUBLICATIONS

Written Opinion of International Application No. PCT/IB2016/057281, dated Feb. 28, 2017, 6 pages.
Search Report under Section 17 of Great Britain Application No. GB1521183.2, dated May 16, 2016, 3 pages.

* cited by examiner

COMPOSITE SHIELDING MATERIAL AND A PROCESS OF MAKING THE SAME

RELATED APPLICATIONS

This application is a national phase application filed under 35 USC § 371 of PCT Application No. PCT/IB2016/057281 with an International filing date of Dec. 1, 2016, which claims priority of GB Patent Application GB1521183.2 filed Dec. 1, 2015. Each of these applications is herein incorporated by reference in its entirety for all purposes.

FIELD OF INVENTION

This invention relates generally to thermal, electromagnetic and acoustic composite shielding materials and, more particularly, to a composite shielding material in the form of syntactic foam comprising of spherical or spherical-like articles coated with a layer of nanostructures such as carbon nanotubes, graphene, graphene flakes, metals and/or alloys. Such articles may be additionally covered with nano-sized metal particles. The spherical or spherical-like articles are encompassed by an organic or inorganic matrix material, and preferably with micro and/or nano-sized reinforcement elements. Such material possesses both reflective and absorptive properties to improve shielding effectiveness. Also process for making the same is disclosed. The composite material can be used as a thermal, electromagnetic or acoustic screen and/or absorber.

BACKGROUND ART

Electromagnetic radiation from high intensity sources can have adverse effects on human health. Likewise, noise and vibration can not only impair health but also have a negative effect on the productivity. The new material would offer a superior alternative for example in shielding rooms in public areas for electromagnetic fields' risk groups (maternity hospitals, hospitals, kindergartens, schools, etc.). In long-term perspective, the implementation of such shields would improve environmental health conditions and result in a positive effect on population's health.

In the automotive industry, the use of the new material as a shock absorbent may save lives and allow reduction of injuries from traffic collisions. Lightweight material would open new avenues for the aerospace industry. Civil construction domain would gain a new construction material, which would allow shielding houses or rooms from high level electromagnetic fields, infrared radiation, and mechanical, including acoustic vibration. Due to the electromagnetic (EM) shielding properties of the material, it could also be used to reduce the risk of industrial espionage from electronic eavesdropping.

There is already known shielding fabric Aaronia-Shield® EMC and RFI. Fabric is made of silver as screening material, and polyamide as carrier material. The transparent, washable, antiseptic RF shielding is optimal for usage as RF window protection, fly screens, curtains [1]. But this material has very high cost and is not high heat resistant. Also, due to material structure fabric is not well fit to heavy-industry or armour components protection.

Known is [2] a lightweight microcellular polyetherimide (PEI)/graphene nanocomposite foams with a density of about 0.3 g/cm$^3$ by a phase separation process. It was observed that the strong extensional flow generated during cell growth induced the enrichment and orientation of graphene on cell walls. The foaming process significantly increased the specific EM shielding effectiveness from 17 to 44 dB/(g/cm$^3$). However, the general properties of these polymers, such as low heat-resistance, poor flame retardancy, and smoke generation, restrict their use as EM shielding material with satisfactory shielding effectiveness (SE) materials in aerospace and other special fields. As well necessary to admit complex multi-stage preparation process of this material such as: long-time and multi stage mixing and vigorous stirring. The drawback of this process is a difficulty of uniform distribution of NS in matrix volume, lack of 100% covering of NS through the material cross-section.

Known are [3] syntactic foams, which can be synthesized by mechanical mixing of hollow microspheres with a matrix material. In this work, a surface modification method employing polydopamine as a surface treatment agent for hollow carbon microspheres (HCM) was used. The silver coated HCM (Ag-PDA-HCMs) impacted the complex permittivity of the syntactic foams leading to high EM shielding effectiveness. The specific EM shielding effect reached up to 46.3 dB·cm$^3$/g, demonstrated the Ag-PDA-HCMs/epoxy syntactic foam as a promising candidate for lightweight high-performance EM shielding material. The drawback is complicated multi-stage preparation process as well as of HCM, as (Ag-PDA-HCMs) including such process as freeze-drying and other; used carbon HS, which is oxidising and combustible (by $O_2$ at high temp) material comparing to ceramic hollow spheres, used in the claimed patent.

Known is [4] spherical core (polystyrene, PS)/shell (polypyrrole, PPy) synthesized via in situ chemical oxidative copolymerization of pyrrole (Py) on the surface of sulfonated PS microsphere followed by the formation of hollow polypyrrole (HPPy) shell by dissolving PS inner core in THF. Thereafter, it has been found that such fabricated novel art of morphology acts as a conducting trap in absorbing electromagnetic (EM) wave by internal reflection. Material has EM SE of HPPy (30-35 dB) significantly higher compared to PPy (20-5 dB) in the frequency range of 0.5-8 GHz due to the trapping of EM wave by internal reflection.

Patent [5] discloses an EM shielding material, consisting of one or more electromagnetic wave-shielding layers and one or more surface layers. The shielding layers are comprised of a thermoplastic resin, an aluminium or aluminium alloy and electrically conductive carbon black. However, it is very difficult to provide flame resistance to compositions containing large amounts of carbon black.

Patent [6] discloses electrically conductive materials that can be used to shield EM radiation, whereas energy-absorptive materials can be used to suppress EM radiation. Disclosed are systems and processes for combining electrically conductive and absorptive materials to improve EM shielding effectiveness. In one embodiment, an absorptive material is combined with the conducting material forming a composite. In another embodiment, absorptive material is combined with electrically conductive material and selectively applied to a substrate, such as a plastic enclosure, to suppress EM radiation incident upon the substrate, thereby reducing the susceptibility of electronics contained within across a broad frequency range.

Since noise problem has become much more complicated and serious and the demands for a better environment and more diversified life styles increase, thin, lightweight and low-cost materials that absorb sound waves in wider frequency regions are strongly desired. Accordingly, researchers have paid much attention to the sound absorbing features of varied granular or particle materials [7-9]. To name a few, metallic hollow spheres were applied as sound absorber for the reduction of noise [8], and ceramic hollow spherical beads were used to prepare acoustic materials [10].

Work [9] describes cement and asphalt concrete specimens with different volume fractions of cenospheres and varying diameter and thickness that were tested to determine their acoustic characteristics over the range of frequencies (0-4000 Hz). Experimental results showed that a 40% volume fraction addition of cenospheres to cement matrix increased the noise reduction coefficient by 100%.

Patent [11] describes similar approach, of involving NS into matrix, where homogeneously mixing 0-20% by weight of carbon nanotubes and 30-90% by weight of resin matrix under continuous stirring, with the addition of stoichiometric quantity of a hardener in case of epoxy resin, or with the addition of stoichiometric quantity of a catalyst mixture in case of cyanate ester resin; additionally adding 10-60% by weight of glass hollow micro spheres HMS to the homogeneous mixture in step (a) to get an uniform dough. With following curing the dough at room temperature for about 24 hours, or at elevated temperatures from 80 to 180° C. for about 2-4 hours and subsequent post curing at elevated temperatures from 100 to 350° C. for about 2-4 hours depending upon the resin system to form a syntactic foam. The drawbacks of this solution are non-uniform distribution of NS in matrix volume, lack of 100% covering of NS through the material cross-section, used glass HMS, with low (550-650° C.) softening temperature. Additionally, cyanate ester resin were used, which is potentially harmful for humans, especially in fire accident when hydrogen cyanide (HCN) evaporates.

Patent [12] describes design and development of carbon nanotubes (CNT) reinforced electrically conducting synthetic foams comprising resin matrix system, carbon nanotubes, hollow glass microspheres and optionally hardener or catalyst for electrical conductivity and related applications especially for EM shielding. However, a shortcoming of this solution is that nano-structured carbon material (carbon nanotubes) reside within the matrix, but not on the surface of the spherical articles. Consequently the mitigation effect of the electromagnetic fields within the material is lower. Also the material does not contain reinforcement elements, which would grant mechanical toughness. Also the material does not include graphene—an effective component to capture the electromagnetic wave. Also, the material does not exhibit any 2D gradient properties in respect to density, particle size, composition, which is necessary to ensure an effective mechanism of internal reflections. Also, the invented material does not contain any metals or alloys coated spherical objects, that in combination with other types of conductive materials provide an effective EM mitigation effect against a wide frequency range.

The patent [13] discloses a graphene polymer composite material with network graphene. A corresponding preparation method comprises the steps of coating the surface of a polymer microsphere by the graphene, to obtain polymer/graphene composite particles; then pressing or pouring and moulding the obtained polymer/graphene composite particles, to obtain the graphene polymer composite material with the network graphene. However, one of the shortcomings of this solution is that the material does not contain reinforcement elements, which would grant mechanical toughness. Material does not contain matrix material, which would add to additional mechanical toughness of the material. Also, the material does not exhibit any 2D gradient properties in respect to density, particle size, composition, which is necessary to ensure an effective mechanism of internal reflections. Also, the invented material does not contain any metals or alloys coated spherical objects, that in combination with other types of conductive materials provide an effective EM mitigation effect against a wide frequency range. Additionally, the material requires a complex way of obtaining the graphene, using hazardous chemicals such as potassium permanganate, sodium nitrate, hydrogen peroxide, hydrochloric acid and hydrogen iodide acid and multistage synthesis process. The obtained composite material has weak mechanical properties, non resistant to organic solvents, high temperature and flames—due to organic material properties The patent [14] describes a foam material, preferably syntactic foam material which comprises of a matrix material, hollow bodies, preferably hollow spheres embedded in the matrix material, and particles influencing the properties of the foam material, preferably reinforcing particles which are arranged on the hollow bodies. However, the drawbacks of this solution are: according to this patent the largest dimension of the claimed structure does not exceed $\frac{1}{500}$ from the maximal hollow bodies size of 900 microns: ($\frac{1}{500}$)×900 microns=1.80 microns, Also the material does not contain millimeter-scale composite rods that would reinforce the material and grant mechanical toughness. Another drawback of the invention is the arrangement of the reinforcement particles on the hollow body surface—the reinforcement is truly effective when positioned within the matrix material. Also, the patent does not describe including micro-sized rods and composite rods reinforcements. Also, the material does not exhibit any 2D/3D gradient properties in respect to density, particle size, composition, which is necessary to ensure an effective mechanism of internal reflections. Considering the small size of the reinforcement elements, and from the aspect of electromagnetic wave theory, since the wavelengths of the electromagnetic wave interact decisively differently with elements of larger size, hence the material has limitations within the electromagnetic frequency range. Additionally, the patent does not describe hollow bodies coated with single or multi-layered metal coating with insulator layer between them.

Carbon nanotubes (CNT) are an allotrope of carbon, one of the most promising exponents providing multifunctional reinforcements to the composite materials. These are essentially long graphene tube-shaped material, having a diameter measuring on the nanometer scale, warped in different angles (chiral angles) and with different circumferential lengths (chiral vector), depending upon which they are able to offer a wide range of mechanical, electrical and thermal properties. However, none of the above described inventions have concentrated on exploiting the capabilities of CNT reinforced syntactic foams in the light of EM shielding requirements and prospective uses as lightweight multifunctional core materials in subsequent sandwich constructions designed for the same purpose.

Single-layer graphene demonstrated an excellent choice of material for high-performance EM shielding. CVD-synthesized graphene shows more than seven times greater EM shielding effectiveness (in terms of dB) than gold film of the same thickness. The ideal monolayer graphene can surprisingly shield as much as 98% of incident waves. CVD-synthesized graphene can shield up to 40%. It means that graphene is the most effective material for EM shielding in terms of shielding effectiveness per mass.

However, obtaining of graphene monolayer in centimetre scale is not simple task. At the same time nanostructures such as CNT, graphene flakes, uniform distribution in a viscous media such as polymer resin and ceramic slurry as well is not simple task. None of the above described inventions have concentrated on exploiting the capabilities of CNT and graphene deposited onto micro-scale material with further uniform distribution in matrix. The reinforced syntactic foams in the light of EM shielding requirements and prospective uses as lightweight multifunctional material.

The goal of the invention is to solve described above problems and other problems by distribution of graphene, CNT, NSMP on to micro scale spherical articles with subsequential distribution thereof in all material volume.

SUMMARY OF THE INVENTION

One aspect of the invention is a method of producing a composite shielding material in the form of a syntactic foam for shielding electromagnetic, acoustic and thermal emissions, said method comprising filling a mould with spherical or spherical-like articles made of ceramics, glass, or carbon, such articles coated with a layer of carbon nanostructures such as such as carbon nanotubes, graphene, graphene flakes and filling the voids between said spherical-like articles in said mould with a matrix material, such as such as polymer resin, ceramic, glass, or metal-ceramic. The articles can be additionally covered with nano-sized metal or alloy particles and/or metal or alloy layer (with a thickness of 5-2000 nm, preferably 10-500 nm for metal particles and 5-2000 nm, preferably 5-500 nm for the single layer) metals such as iron, nickel, cobalt, chromium, tungsten, zinc, copper, silver, gold, platinum, palladium, rhodium, titanium, aluminium, magnesium, scandium, and/or their combination (as mixture of powders or alloys) deposited on the surface of the spherical articles. Metal alloys could be such as 316, 304, 41xx steels, AlSi27, AlSi70 or other. Nano-sized metal particles and/or metal or alloy layer could be coated with graphene layer. Spherical articles can have multiple metal layers separated by an insulating layer such as $Al_2O_3$, $SiO_2$, BN, SiC or other with a thickness of 5-2000 nm, preferably 3-300 nm. Additionally spherical articles could have multiple metal layers separated by the insulating layer such as $Al_2O_3$, $SiO_2$, BN, SiC or other with a thickness of 20-2000 nm, preferably 100-1000 nm. Additionally spherical articles could have multiple graphene/metal layers separated by the electric non-conductive material insulator such as $Al_2O_3$, $SiO_2$, BN, SiC or other with a thickness of 20-2000 nm, preferably 100-1000 nm. The metal layer is considered both a single type of metal layer and metal alloys layer. The composite material may additionally comprise of micro and/or nano-sized reinforcement elements mixed into the matrix material. Such composite material possesses both reflective and absorptive properties to improve shielding effectiveness. It can be used as shield against electromagnetic, acoustic, and thermal emissions.

The outer layer of the spherical or spherical like articles (SA) is defined as the layer which is most distant from the center of the SA. The inner layer of the SA is the layer towards the center of the SA starting from the outer layer.

Another aspect of the invention is a shielding composite material for protection people and equipment from the effects of electromagnetic, and acoustic emissions, comprising of the spherical or spherical-like articles encompassed by an organic or inorganic matrix material, said articles coated with carbon nanostructures (NS), nano-sized metal particles (NSMP), nanoscale layer(s) of inorganic isolator between graphene layers, matrix material, preferably reinforced by micro- and nano-sized structures.

Another aspect of the invention is a shielding composite material for protecting people and equipment from the effects of electromagnetic, acoustic, and thermal emissions, said material comprising spherical or spherical like articles (SA), made from ceramics, glass or carbon, said articles coated with carbon nanostructures (NS) such as graphene, graphene flakes, graphite, carbon nanotubes (CNT), and/or nano-sized metal particles (NSMP) such as iron, nickel, cobalt, chromum, copper, silver, gold, platinum, palladium, rhodium, titanium, and their combination (alloys). Additionally, articles can have nanoscale (3-300 nm) layer(s) of inorganic insulator between graphene layers, such as alumina, silica, boron nitride, boron carbide. The articles are distributed within the matrix material such as polymer resin, ceramic, glass, or metal-ceramic, additionally reinforced with micro- and nano-sized rods (rods is a object with aspect ratio of length to diameter higher than 10. In case of transverse section differ from circle the diameter is a circle diameter where can be written the real transverse section), distributed in the matrix.

BRIEF DESCRIPTION OF THE DRAWINGS

The present invention can be better understood with reference to the following drawings—The drawings are not necessarily to scale, emphasis instead being placed upon clearly illustrating principles of the present invention.

FIG. 11 depicts a cross-section of the material by Scanning Electron Microscope (SEM) with magnification ×200 (a) and micro-computational tomography, magnification ×30 (b) images FIG. 12 explains the meaning of gradient in this invention, in this particular case the gradient of material density.

EXAMPLES OF CARRYING OUT THE INVENTION

Figure 1A:
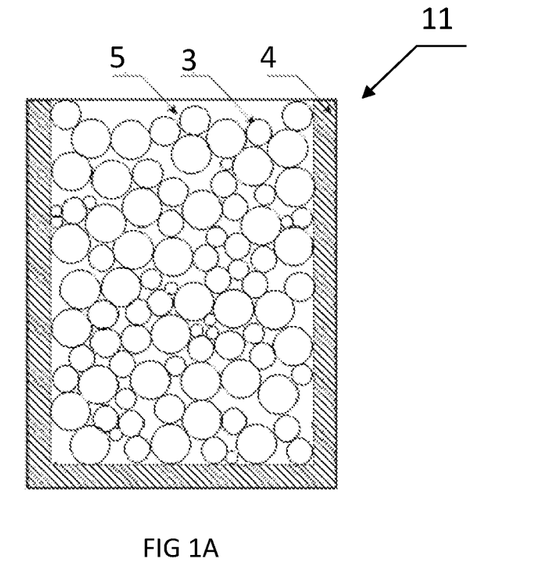
FIG. 1A depicts a composite material according to one embodiment of the invention

The composite material 11 according to one embodiment is depicted in FIG. 1A. The composite material comprises of spherical articles 3 of different sizes encompassed by the matrix material 5. Mould 4 is used to manufacture the composite material.

Figure 1B:
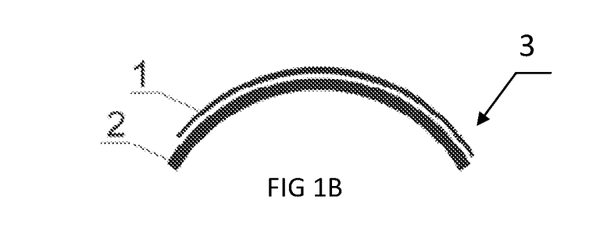
FIG. 1B is a cross-section of the spherical article (SA) coated with graphene layers

The material according to present invention is made of spherical or spherical-like articles (hereinafter spherical articles or SA) 3, for example as depicted in FIG. 1B, wherein the surface 2 of the SA is coated with a layer 1 comprising carbon nanostructures (NS) such as graphene.

Said spherical articles are solid or hollow with wall thickness 5-20% from external diameter, and can be made of carbon, glass, as of pure alumina, silica, zirconia, boron nitride, tungsten carbide, silicone carbide as well of mixture of such materials in different proportions. Said SA can also be partially spherical, or having an elongated shape (ellipsoids with larger diameter D to smaller diameter d, e.g., from 1 to 10), or having otherwise non-regular shape. Said SA may be hollow or solid half sphere. Said spherical articles can be an agglomeration of two or more individual spherical articles.

Figure 2:
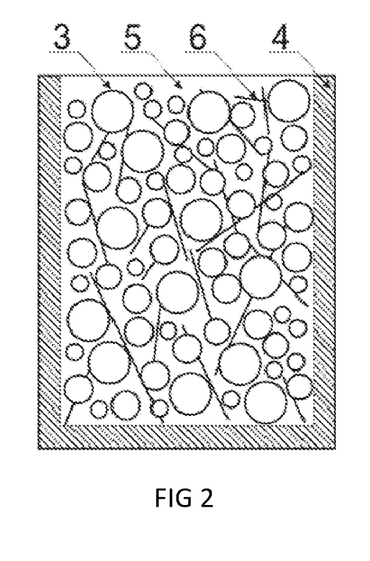
FIG. 2 depicts a material according to one embodiment of the invention

Another embodiment of the material according to present invention is depicted in FIG. 2. The material comprises of the SA 3 of different sizes encompassed by the matrix material 5. Mould 4 is used to manufacture the composite material. The embodiment as shown in FIG. 2 also comprises of reinforcing micro rods 6, made of alumina, boron nitride or silicon carbide, tungsten, boron, or combination thereof. Rods are understood to have length to diameter ratio 10 or more. Such micro rods have diameter 20-300 μm and length 500-20000 μm. Such micro rods can be self-reinforced composite rods having inner rods made from tungsten wire with diameter 5-30 μm, and boron outer shell with thickness 40-150 μm, with diameter 100-200 μm and length 500-20000 μm added.

Matrix material 5 can be an organic matter such as: an epoxy, various polymers, silicone, rubber, ethylene propylene diene monomer (EPDM), fuorosilicone, polyoxypropylene POP), or inorganic: ceramics, glass and combination thereof, in a liquid condition (as slurry or molten in case of inorganic matrix material).

The matrix material may require curing, e.g., at room temperature for about 15-35 hours, or at elevated temperatures in the range of 80-180° C. for about 1-5 hours and subsequent post curing at elevated temperatures in the range of 100-350° C. for about 2-6 hours depending upon the system to form a syntactic foam.

Figure 3A:
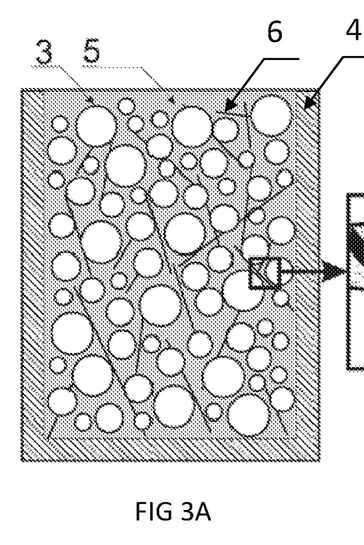
FIG. 3A depicts a material according to another embodiment of the invention and FIG. 3B is enlarged view of the material.
Figure 3B:
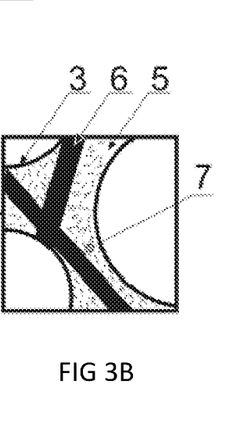

Another embodiment is shown in FIG. 3. The composite material comprises of the SA 3, micro rods 6, nanorods 7 (diameter 4-100 nm and length 50-10,000 nm) encompassed by the matrix material 5. The nanorods are for reinforcement purposes. Mould 4 is used to manufacture the composite material. The nanorods also have length to diameter ratio 10 or more. The nanorods can be made from as pure alumina, silica, zirconia, boron nitride, silicone carbide as well of mixture of these, additionally nano-rods can be previously coated by graphene.

The distribution range η of said spherical articles (SA) within the matrix material can be from 0.95 to 0.50, where η=(SA minimal diameter)/(SA maximal diameter). In other words, the SAs can be relatively uniformly dimensioned. Alternatively, the SA distribution range η can be between 0.5 to 0.001, i.e., the SAs can be substantially differently dimensioned.

Figure 4:
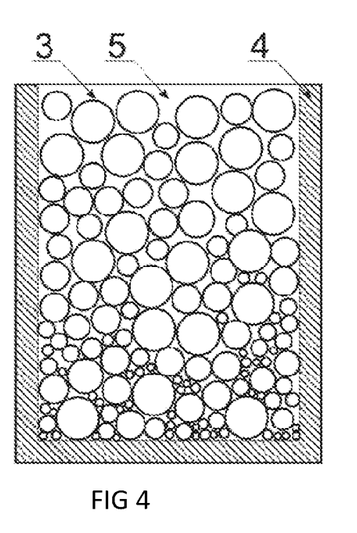
FIG. 4 depicts a material according to yet another embodiment of the invention.

The embodiment shown in FIG. 4 has increasing distribution range η growing up from one side of the composite material to the other side of the composite material, increasing from very low (e.g., 0.001) to very high (e.g., 0.95), resulting in gradient structure and thereby also in gradient properties of the material.

Figure 5:
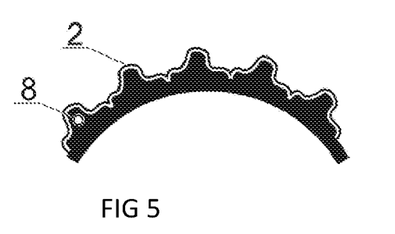
FIG. 5 depicts a cross-section of the spherical article according to another embodiment.

FIG. 5 depicts another embodiment of the spherical article, where the surface 2 is etched to form extended surface 8 before graphene coating.

Figure 6:
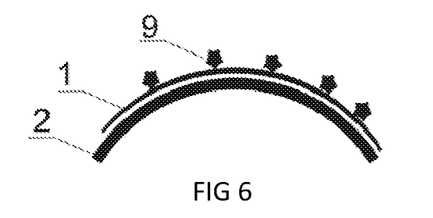
FIG. 6 depicts a cross-section of the spherical article according to another embodiment.

FIG. 6 depicts yet another embodiment of the spherical article. The surface 2 of the spherical article 3 is coated with graphene layer 1, covered with nanoscale metal particles 9 such as iron, nickel, chromium, copper, silver, gold, platinum palladium, rhodium, titanium.

Figure 7:
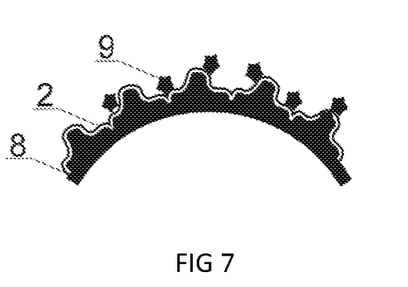
FIG. 7 depicts a cross-section of the spherical article according to another embodiment.

FIG. 7 depicts another embodiment of the spherical article, where the extended surface 8 is coated by graphene layer 2 and subsequently decorated with metal nano particles 9

Figure 8:
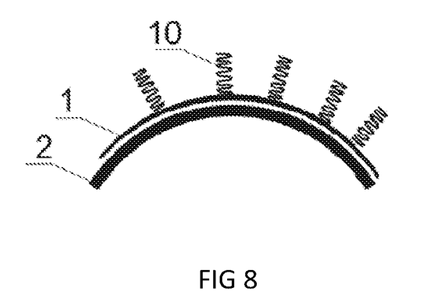
FIG. 8 depicts a cross-section of the spherical article according to another embodiment.

FIG. 8 depicts another embodiment of the spherical article where the surface 2 is coated with graphene layer 1 and carbon nanotubes 10.

Figure 9:
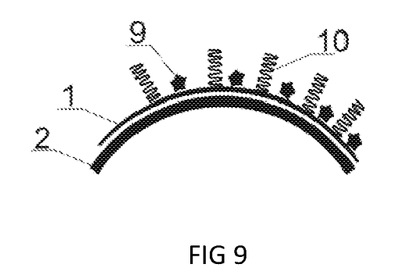
FIG. 9 depicts a cross-section of the spherical article according to another embodiment.

FIG. 9 depicts another embodiment of the spherical article, where the surface 2 is coated by graphene layer 1 and subsequently decorated with metal nano particles 9 and carbon nanotubes 10.

Figure 10:
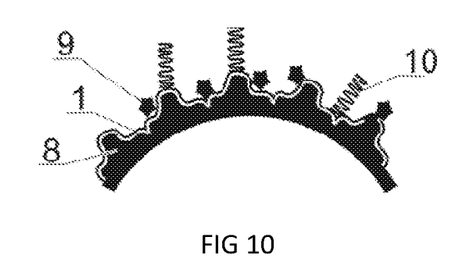
FIG. 10 depicts a cross-section of the spherical article according to another embodiment.

FIG. 10 depicts yet another embodiment of the spherical article where the surface 2 is etched to form an etched surface 8 is, coated by graphene layer 1, and subsequently decorated with metal nano particles 9 and carbon nano tube 10.

Different methods can be used for coating the spherical articles, e.g., the graphene, graphite or carbon nanotubes layer can be deposited by chemical vapour deposition (CVD). Graphene flakes can be deposited by precipitation or spray coating.

Figure 11A:
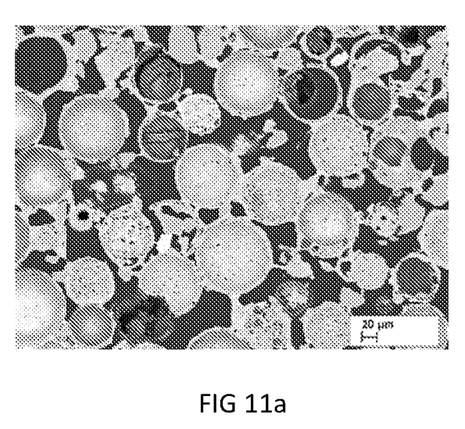
Figure 11B:
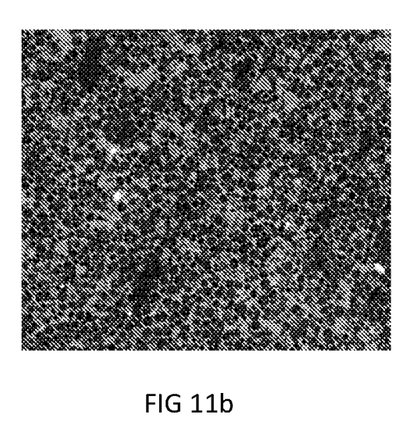

FIG. 11 is a cross section of material of FIG. 1 by Scanning Electron Microscope with magnification ×200 (FIG. 11a) and micro computational tomography, magnification ×30 (FIG. 11b) images.

The method according to one embodiment of the invention includes the steps of filling a mould with spherical or spherical like articles, said articles coated with nanostructures such as carbon nano structures (NS) such as carbon nanotubes (CNT), graphene; and filling the mould with matrix material in liquid form.

According to one embodiment, during the filling of the mould 4 with spherical articles 3, additionally mould 4 vibration is used to evenly distribute the articles.

According to one embodiment, after filling the mould 4, with the spherical articles 3 the thermal or spark plasma sintering is used.

The present invention proposes the production of the syntactic foam material comprising of steps of depositing graphene layers on spherical articles (SA), filling the mould with graphene layer coated spherical articles (GCSA), filling the voids between the spherical articles with matrix material, such as organic matter, such as epoxy, various polymers, silicone, rubber, ethylene propylene diene monomer, fluorosilicone, polyoxypropylene, or inorganic matter such as ceramics, glass and combination thereof, in a liquid condition (as slurry or molten in case of inorganic matrix material).

During the filling of the mould with the matrix material, reduced pressure (in the mould) can additionally be used.

In case of matrix material has organic matter—curing at room temperature for about 15-35 hours, or at elevated temperatures in the range of 80-180° C. for about 1-5 hours and subsequent post curing at elevated temperatures in the range of 100-350° C., is used. For about 2-6 hours depending upon the system to form a syntactic foam. In case of self-hardening inorganic slurry curing can be carried out at 20-100° C. for 50-100 hours, or 20-30° C. for 5-15 days.

In all embodiments, the matrix material, with reinforcing nano-rods with diameter of 4-100 nm and length of 50-10, 000 nm are dispersed. The nano-rods can be made from pure alumina, silica, zirconia, boron nitride, silicone carbide as well of mixture of these, additionally nano-rods can be previously coated by graphene.

In all embodiments, the spherical articles can be solid or hollow with wall thickness of 5-20% from external diameter. The articles can be made of carbon, glass, as of pure alumina, silica, zirconia, boron nitride, silicon carbide as well of mixture of them.

In all embodiments, the spherical articles before graphene layer deposition can be coated with NSMP such as iron, nickel, chromium, copper, silver, gold, platinum palladium, rhodium, titanium.

In all embodiments, the SA distribution range η is from 0.99 to 0.01, where η=(minimal average diameter of SA)/(maximal average diameter of SA). In some embodiments, the SA distribution range is from 0.99 to 0.5, i.e., the material is made of relatively uniform size articles. In some embodiments, the distribution range is from 0.01 to 0.5, i.e., the material is made of particles of substantially different sizes.

In all embodiments, the SA distribution range η can be substantially different in different areas of the material, e.g., across the cross section of the composite material, thereby providing composite materials with finely tuned absorption and reflective properties. For example, the distribution range η may be largest on one side of the composite material and smallest on the other side of the composite material (i.e., the distribution range η is growing up (from 0.01 to 0.95). The SA is filled into the mould, layer by layer, forming a material with gradient properties (gradient structure). Such structure is depicted in FIG. 4. The distribution range η can also increase at the beginning and then decrease (or vice versa) across the cross section.

In all embodiments, the distribution range η, type of coating can be also different in other directions of the composite materials and can change linearly, or according to predetermined formula (e.g., sin wave), i.e., can have a gradient, e.g., as described in FIGS. 12 to 21, or have different discrete values in different parts of the composite material.

Figure 12:
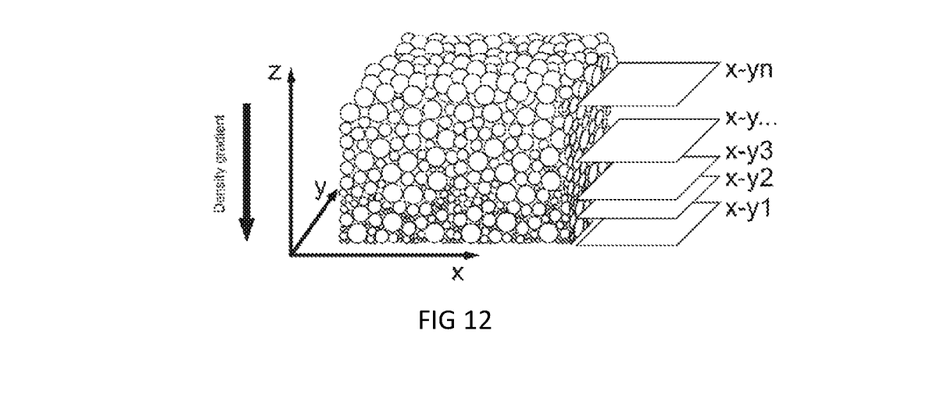

FIG. 12 shows the material with 1D gradient, where material properties (for example the density particle size, coating thickness or coating type) changes only by Z axis, but in each separate x-y layer is the same.

Figure 13:
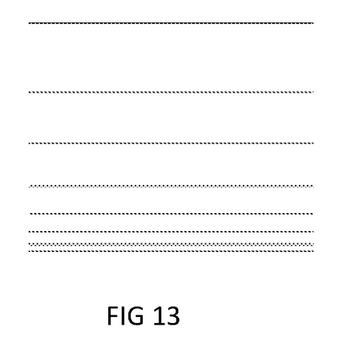
FIG. 13 is a planar representation of linear gradient.

FIG. 13 shows schematic interpretation of 1D gradient shown on FIG. 12.

Figure 14:
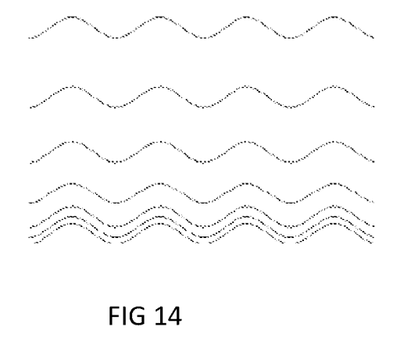
FIG. 14 is a planar representation of 2D sinusoidal gradient.

FIG. 14 demonstrates 2D gradient material, where material properties change by x, y and z axis.

Figure 15:
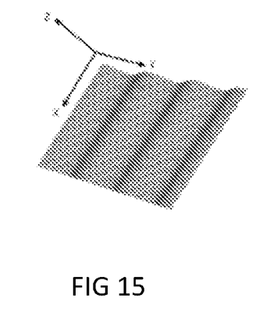
FIG. 15 is an axonometric representation of 2D sinusoidal gradient.

FIG. 15 shows one layer of the 2D gradient material with equal properties. It has wave structure described by a single sinusoidal formula.

Figure 16:
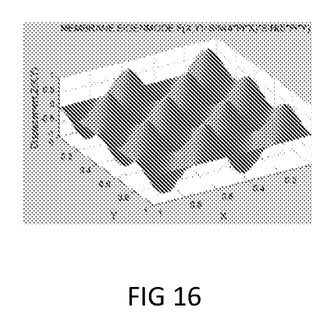
FIG. 16 is an axonometric representation of 3D sinusoidal gradient.

FIG. 16 shows one layer of the 2D gradient with equal properties. It has wave structure described by double sinusoidal formula.

Figure 17:
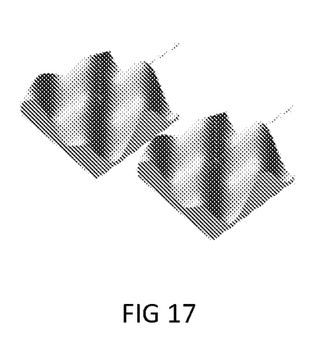
FIG. 17 is an axonometric representation of 3D sinusoidal gradient single "tile" element (shown are two pieces).

FIG. 17 shows two pieces of tiles of 2D gradient material. To tiling by these elements is possible to obtain continuous surface of 2D gradient material with wave structure described by double sinusoidal formula shown on FIG. 19.

Figure 18:
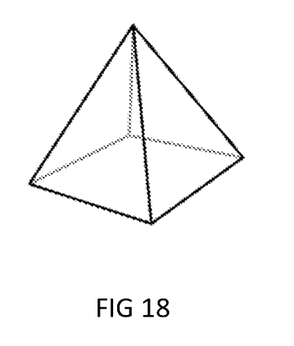
FIG. 18 is an axonometric representation of Pyramidal gradient single tile element.
Figure 19:
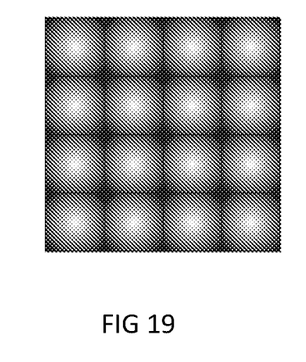
FIG. 19 is a schematic representation of surface made of 3D sinusoidal gradient elements.
Figure 20:
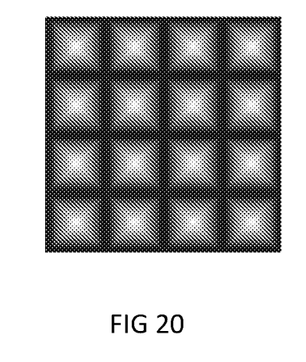
FIG. 20 is a schematic representation of surface made of pyramidal gradient elements.

FIG. 18 is shown one piece of tiles of 2D gradient material. To tiling by these elements is possible obtain continuous surface of of 2D gradient material with a conic structure it is shown on FIG. 20.

Figure 21:
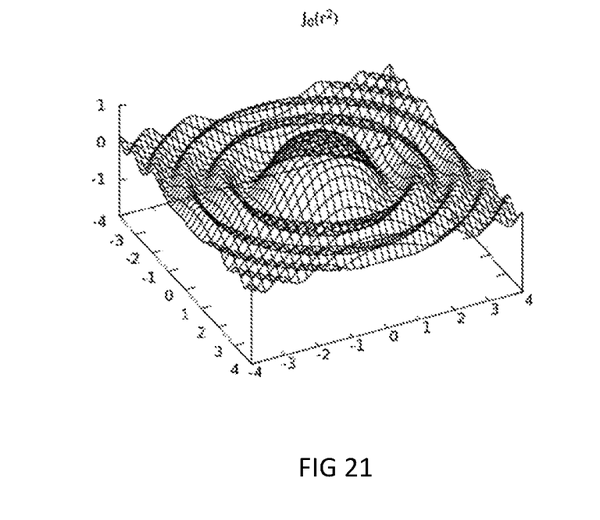
FIG. 21 is a schematic representation of 3D by complex formula gradient.

However, the material density can be changing throughout the material not only by linear law (the cone shown on FIGS. 18 and 19) or sinusoidal (the waves shown on FIGS. 15, 16, 17 and 19) but also according to another, more complex formulas (see, FIG. 21).

The material according to the invention preferably comprises a mixture of articles of different type, wherein the composition of the mixture varies from one portion of the material to another portion of the material (e.g., from one layer to the other layer) at least in one direction of the material, thereby creating a material with changing properties in at least on direction, thereby forming a gradient structure. The different types of articles include:

hollow or non-hollow spherical or spherical like articles made of ceramics, glass, or carbon, such articles coated with carbon nanostructures, such as carbon nanotubes, graphene, and graphene flakes;

hollow or non-hollow spherical or spherical like articles made of ceramics, glass, or carbon coated with at least one metal layer, the metal layer preferably having thickness from about 10 to about 2000 nm;

hollow or non-hollow spherical or spherical like articles made of ceramics, glass, or carbon has at least two layers of coating: outer coating of graphene, and bottom layer or layers of metal (or metals), said metal layer (or layers) preferably having thickness of 10 to about 2000 nm; and hollow or non-hollow spherical articles made of ceramics, glass, or carbon coated with two or more metal layers, preferably having thickness from about 10 to about 2000 nm, which are separated by a layer of insulating material.

The composition of the articles may include these different types of articles in any combination, having two or more types of articles in the mixture in any proportion. By varying the concentration of each types of articles from portion to portion of the material (e.g., from layer to layer through the cross section of the material) in at least one direction so that the material can have finely tuned electromagnetic and/or mechanical and/or sound absorption and reflective properties. For example, the content of the metal coated article may be highest on one side of the composite material and smallest on the other side of the material (i.e., the concentration is decreasing, e.g., from 95 vol % to 0 vol %) filled in the mould, layer by layer, forming a gradient structure. Such structure is depicted in FIG. 12. The content of the metal coated SA can also first increase and then decrease (or vice versa) across the cross section of the material.

REFERENCES

[1] KALTMANCREATIONS_LLC. RF Shielding Products For Many Uses 2015. http://aaroniausa.com/rf-spectrum-analyzer/rf-shielding-products/ (accessed Apr. 20, 2015).

[2] Ling J, Zhai W, Feng W, Shen B, Zhang J, Zheng W G. Facile Preparation of Lightweight Microcellular Polyetherimide/Graphene Composite Foams for Electromagnetic Interference Shielding. ACS Appl Mater Interfaces 2013; 5:2677-84. doi:10.1021/am303289m.

[3] Zhang L, Roy S, Chen Y, Chua E K, See K Y, Hu X, et al. Mussel-Inspired Polydopamine Coated Hollow Carbon Microspheres, a Novel Versatile Filler for Fabrication of High Performance Syntactic Foams. ACS Appl Mater Interfaces 2014; 6:18644-52. doi:10.1021/am503774a.

[4] Panigrahi R, Srivastava S K. Trapping of microwave radiation in hollow polypyrrole microsphere through enhanced internal reflection: A novel approach. Sci Rep 2015; 5:7638. doi:10.1038/srep07638.

[5] Kanda M, Hatakeyama T, Morito Y. Multilayer-thermoplastic resin, aluminum (alloy of) and carbon black. U.S. Pat. No. 4,508,640 A, 1985.

[6] Jeff M, Martin R. Composite EMI shield. US 20040020674 A1, 2004.

[7] Zwikker C, Kosten C W. Sound absorbing materials 1949:ix, 174.

[8] Hbelt J, Zeibig A, Kostmann C, Stephani G. Parameter of metallic hollow spheres—a porous sound absorbing material. ICA2004, 18th Int. Congr. Acoust., Kyoto, Japan: 2004.

[9] Tiwari V, Shukla A, Bose A. Acoustic properties of cenosphere reinforced cement and asphalt concrete. Appl Acoust 2004; 65:263-75. doi:10.1016/j.apacoust.2003.09.002.

[10] Ahuja K K. Apparatuses and methods for sound absorption using hollow beads loosely contained in an enclosure. U.S. Pat. No. 5,777,947 A, 1998.

[11] Sankaran S, Dasgupta S, Kandala R S, Narayana R B. Electrically conducting syntactic foam and a process for preparing the same. US 20110101284 A1, 2011.

[12] Sundaram, Sankaran Samudra D, Ravi Sekha r K, Narayana Ravishankar B. Electrically conducting syntactic foam and a process for preparing the same. WO 2009101498 A2, 2008.

[13] Wang Z, Yang L, Ji Y, Xue Q, Wang J. Graphene polymer composite material with network graphene, and preparation method thereof. CN 103554702 A, 2013.

[14] Stefan F. Foam material, preferably syntactic foam material comprises matrix material, hollow bodies embedded in matrix material, and particles influencing properties of foam material, preferably reinforcing particles arranged on hollow bodies. DE 102013007999 A1, 2012.

The invention claimed is:

1. A composite shielding material for shielding an electromagnetic radiation, said composite shielding material comprising a matrix material and spherical articles encompassed by said matrix material, wherein said spherical articles are made of ceramics, glass or carbon, wherein said spherical articles are coated with at least one layer of graphene, wherein said graphene is selected from the group consisting of graphene flakes, carbon nanotubes, and a mixture thereof, and wherein said spherical articles further comprise at least one metal layer.

2. The composite shielding material of claim 1, wherein said spherical articles include spherical articles that are coated with two or more metal layers, said metal layers separated from each other by one or more insulating layers.

3. The composite shielding material of claim 2, wherein the spherical articles that are coated with two or more metal layers further comprise at least one layer of graphene disposed on an outside surface of an innermost of the two or more metal layers, beneath the one or more insulating layers.

4. The composite shielding material of claim 1, further comprising a second type of spherical articles made of ceramics, glass or carbon, said second type of spherical articles coated only either with (i) a single metal layer on an external surface of said second type of spherical articles or (ii) two or more metal layers separated from each other by one or more layers of an insulating material.

5. The composite shielding material of claim 1, wherein said composite shielding material further comprises a second type of spherical articles made of ceramics, glass or carbon, wherein said second type of spherical articles are any of the following 1 through 4: 1. coated with a single metal layer; 2. coated with at least two metal layers, said metal layers separated from each other by one or more layers of insulating material; 3. coated with a metal layer and a graphene layer on said metal layer; and 4. coated with one or more metal layers, one or more insulating layers between said one or more metal layers, and at least one graphene layer, wherein said at least one graphene layer comprises carbon nanotubes or carbon flakes, and wherein the at least one graphene layer is present on one or more metal layers.

6. The composite shielding material of claim 5, wherein said composite shielding material comprises layers of mixture of said spherical articles, wherein the concentration of each type of said spherical articles varies from layer to layer, whereby a gradient structure is formed in at least one direction of the composite shielding material.

7. The composite shielding material of claim 1, wherein said spherical articles further comprise a layer of nano-sized metal particles in addition to said at least one layer of graphene and in addition to the at least one metal layer, wherein said nano-sized metal particles are selected from the group consisting of aluminium, iron, nickel, cobalt, chromium, copper, silver, gold, platinum, palladium, rhodium, titanium, and mixtures or alloys of such materials.

8. The composite shielding material of claim 1, wherein said matrix material is an organic material selected from the group consisting of epoxy, polymers, silicone, rubber, ethylene propylene diene monomer (EPDM), fluorosilicone, and polyoxypropylene (POP) or an inorganic material selected from the group consisting of ceramics, glass, and metal-ceramic material.

9. The composite shielding material of claim 1, wherein said matrix material further encompasses microsized rods or nanosized rods, said microsized rods and said nanosized rods having aspect ratio of length to diameter higher than 10:1.

10. The composite shielding material of claim 1, wherein said composite shielding material comprises layers of said spherical articles, each layer having distribution range $\eta$=(minimal average diameter of SA)/(maximal average diameter of SA), wherein the layers of said spherical articles are arranged so that said $\eta$ is alternated from a low value from about 0.01 to about 0.5 to a high value from about 0.5 to about 0.95 from one layer to the other in at least in one direction of the composite shielding material, whereby a gradient structure of the composite shielding material is formed.

11. The composite shielding material of claim 9, wherein said nanosized rods have a diameter from about 4 nm to about 100 nm and length from about 50 nm to 10,000 nm, wherein the nanosized rods are made from pure alumina, silica, zirconia, boron nitride, silicon carbide, or their mixtures or alloys, and wherein said nanosized rods are covered with a graphene.

12. The composite shielding material of claim 9, wherein said microsized rods have a diameter from about 20 μm to about 300 μm and length from about 500 μm to about 20,000 μm.

13. A method of producing a composite shielding material in the form of a syntactic foam for shielding an electromagnetic radiation (EMR), said method comprising:

filling a mould with spherical articles made of ceramics, glass, or carbon, wherein said spherical articles are coated with a layer of graphene, wherein said graphene is selected from the group consisting of carbon nanotubes, graphene flakes, and a mixture thereof, and wherein said spherical articles further comprise at least one metal layer; and filling the voids between said articles with a matrix material, wherein the composite shielding material created comprises:

a matrix material and spherical articles encompassed by said matrix material, wherein said spherical articles are made of ceramics, glass or carbon, wherein said spherical articles are coated with a layer of graphene, wherein said graphene is selected from the group consisting of graphene flakes, carbon nanotubes, and a mixture thereof, and wherein said spherical articles further comprise at least one metal layer.

14. The method of claim 13, further comprising the step of curing and post-curing said matrix material in said mould.

15. The method of claim 13, further comprising the step of vibrating said mould during the step of filling said mould with spherical articles.

16. The method of claim 13, further comprising applying an electric, magnetic or electromagnetic field to said mould during the steps of filling the mould with spherical articles, filling with matrix material, and curing of matrix material.

17. The method of claim 13, further comprising the steps of vibrating said mould during the step of filling said mould with spherical articles and subsequently performing either i) the step of thermal sintering in a vacuum or an inert atmosphere or reducing atmosphere or ii) a step of spark plasma sintering.

* * * * *